United States Patent [19]

Asano et al.

[11] Patent Number: 4,563,601
[45] Date of Patent: Jan. 7, 1986

[54] LEVEL CONVERSION INPUT CIRCUIT

[75] Inventors: Michio Asano, Kokubunji; Akira Masaki, Meguro, both of Japan

[73] Assignee: Hitachi, Ltd., Tokyo, Japan

[21] Appl. No.: 529,763

[22] Filed: Sep. 6, 1983

[30] Foreign Application Priority Data

Sep., 1982 [JP] Japan ................................. 57-153901

[51] Int. Cl.[4] ................. H03K 19/094; H03K 19/017; H03K 19/092
[52] U.S. Cl. .................................... 307/475; 307/443
[58] Field of Search ............... 307/475, 443, 446, 264, 307/290, 491

[56] References Cited

U.S. PATENT DOCUMENTS

| 4,023,050 | 5/1977 | Fox et al. | 307/475 X |
| 4,150,308 | 4/1979 | Adlhoch | 307/475 |
| 4,242,604 | 12/1980 | Smith | 307/290 X |
| 4,453,095 | 6/1984 | Wrathall | 307/475 |

OTHER PUBLICATIONS

Hoffman, "Positive Voltage Translation Circuit", IBM Tech. Discl. Bull.; vol. 17, No. 8, pp. 2392-2393; 1/75.

Primary Examiner—Larry N. Anagnos
Attorney, Agent, or Firm—Antonelli, Terry & Wands

[57] ABSTRACT

An input circuit is provided for converting an ECL level to a CMOS level. The input circuit of the invention includes a first input circuit having at least a P-type MOSFET and an N-type MOSFET connected in series. The gate of the P-type MOSFET is connected to the input of the circuit for receiving an input signal of the ECL level and the output of the circuit is taken out from between both MOSFETs. A voltage generation circuit is also provided for applying a voltage to the gate of the N-type MOSFET of the first input circuit to control the logic threshold voltage of the first input circuit. The voltage generation circuit includes a second circuit, which receives a logic threshold voltage of ECL as its input and is equivalent to the first input circuit, and an amplification circuit of at least one stage which receives the output of the second input circuit and the logic threshold voltage of CMOS as its input and amplifies the difference between them.

15 Claims, 10 Drawing Figures

LEVEL CONVERSION INPUT CIRCUIT

BACKGROUND OF THE INVENTION

This invention relates to a level conversion circuit. More particularly, the present invention relates to an input circuit for converting a signal level of ECL (emitter coupled logic) to a signal level of CMOS (complementary metal oxide semiconductor) and to a low power level conversion input circuit suitable as an input circuit of logic LSI.

Recently, CMOS LSI has come to possess a higher circuit speed than TTL (transistor transistor logic) and it has now become possible for CMOS LSI to be used together with ECL LSI. To use CMOS LSI together with ECL LSI, the input-output signal levels of both LSIs must be matched and in particular, an input circuit for converting a signal of an ECL level ($-0.9 \sim -1.7$ V) to a signal of a CMOS level ($0 \sim -5$ V) is necessary. An example of a CMOS input circuit compatible to ECL is illustrated in FIG. 1. In the drawing, $P_1$ through $P_4$ are P-MOS transistors and $N_1$ through $N_9$ are N-MOS transistors. A circuit 1 formed by $P_1$, $P_2$, $N_1$, $N_2$, $N_3$ is a differential input amplifier, and a circuit 2 formed by $N_4$, $N_5$, $N_6$, $N_7$ is a level shifter. A circuit 3 formed by $P_3$, $P_4$, $N_8$, $N_9$ is a buffer. $V_{DD}$ and $V_{SS}$ are power source voltages. $BIAS_1$ determines a constant current value of the differential amplifier 1 while $BIAS_2$ is applied so as to determine a load resistance. $V_{bb}$ is a reference voltage applied to determine the logic threshold voltage of the ECL circuit. ECL INPUT and CMOS OUTPUT represent the signal input of the ECL level and the signal output of the CMOS level, respectively. Since the ECL signal has low amplitude, the circuit shown in FIG. 1 uses a differential amplifier for its initial stage to prevent the operation from becoming unstable with respect to the statistical variation of devices and to the fluctuation of temperature and power source voltages. The output of this differential amplifier is further amplified over two stages and is converted to the CMOS level. If the delay time of this circuit is reduced, the current of the differential amplifier must be increased so that the power consumption becomes extremely great. Accordingly, though this circuit can be employed for an RAM (random access memory) or the like having a small number of input signals, it can not be employed for a logic LSI because the number of input signals is great and the power consumption of the input circuit alone becomes as great as several Watts.

SUMMARY OF THE INVENTION

It is therefore an object of the present invention to provide a level conversion input circuit which has high speed performance but low power consumption and is stable to the statistical variation of devices and to the fluctuation of temperature and power source voltages. It is a further object of the present invention to provide an improved level conversion input circuit for converting a signal level from an ECL level to a CMOS level.

To accomplish these and other objects, a level conversion input circuit in accordance with the present invention comprises an input circuit consisting at least of a first MOS transistor and a second MOS transistor connected in series, whereby the gate of the first MOS transistor is connected to a circuit input for receiving an input signal and the output of the circuit is taken out from between the first and second MOS transistors. A voltage generation circuit is also provided for applying a voltage to the gate electrode of the second MOS transistor inside the input circuit, the voltage from the voltage generation circuit being used to control the logic threshold voltage of the input circuit.

DESCRIPTION OF THE PREFERRED EMBODIMENTS

Figure 1:
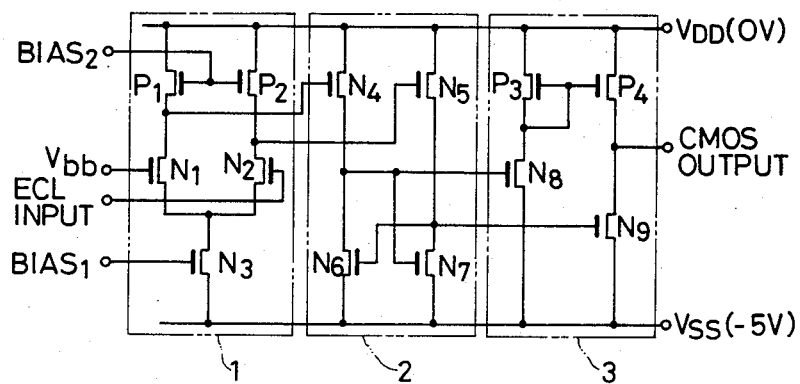
FIG. 1 is a circuit diagram showing the construction of a conventional ECL-compatible MOS input circuit.
Figure 2:
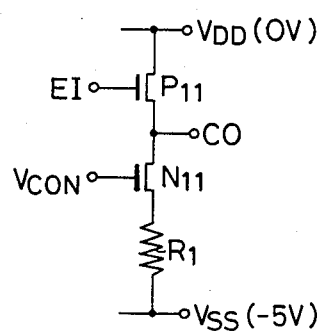
FIG. 2 is a circuit diagram showing the construction of an input circuit in accordance with one embodiment of the present invention.
Figure 3:
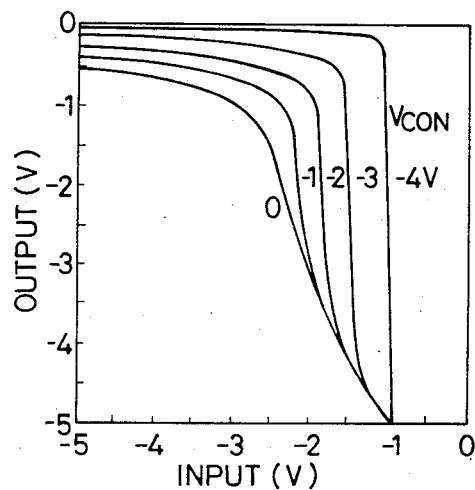
FIG. 3 is a diagram showing the transfer characteristics of the circuit shown in FIG. 2.

The principle of operation of the present invention will be now described. FIG. 2 shows the circuit construction of the input circuit of the present invention and FIG. 3 shows its transfer characteristics. The input circuit of the present invention consists of a P-type MOS transistor (P-MOS FET) P11, an N-type MOS transistor (N-MOS FET) N11 and a load resistor R1 that are connected in series between power source voltages $V_{DD}$ and $V_{SS}$. The gate electrode of P-MOS FET P11 is connected to the circuit input EI from which the circuit receives a signal input of an ECL level, and the circuit output CO is picked up from between P-MOS FET P11 and N-MOS FET N11.

This input circuit utilizes the change of its transfer characteristics, illustrated in FIG. 3, in accordance with a voltage $V_{CON}$ applied to the gate electrode of N-MOS FET N11. In other words, an input circuit for converting the ECL level ($-0.9 \sim -1.7$ V) to the CMOS level ($0 \sim -5$ V) can be obtained by generating a control voltage $V_{CON}$ and applying it to the gate electrode of N-MOS FET N11 so that the logic threshold voltage of this input circuit becomes a reference voltage such as a logic threshold voltage $V_{BB}$ ($-1.3$ V) of the ECL circuit, for example, and that the logic threshold voltage does not vary with statistical variation of the devices or with the fluctuations of temperature and power source voltages.

One embodiment of the present invention will be explained with reference to FIG. 4. In this drawing, symbols P12, N12 and R2 represent an P-type MOS transistor (P-MOS EET), an N-type MOS transistor (n-MOS FET) and a load resistor that are equivalent to P11, N11 and R1 shown in FIG. 2, respectively. They form an input circuit equivalent to the input circuit shown in FIG. 2. A predetermined reference voltage $V_{BB}$, that is, the logic threshold voltage of ECL, is applied to the gate electrode of FET P12 as the input of the circuit 71, in place of the ECL input signal. The output 4 picked up from between P-MOS FET P12 and N-MOS FET N12 is applied to a differential amplifier of the next stage 72. Symbols N13 and N14 represent N-type MOS transistors (N-MOSFETs) and R3, R4 and R5 represent resistors. The sources of N-MOS FETs N13 and N14, that are connected in parallel, are connected with each other, and the source junction is connected to the power source voltage $V_{SS}$ via the resistor R5. Their drains are connected to the power source voltage $V_{DD}$ via the resistors R3 and R4, respectively. Thus, a differential amplifier 72 using each gate as the input is formed. In this case, the resistor R5 functions as a constant current source. The output 6 of this differential amplifier 72 is picked up from between the resistor R3 and N-MOS FET N13.

Here, the load resistor R4 of the N-MOS transistor N14 can be eliminated because the output on only one side is used. It is also possible to use a P-MOS transistor in place of R3 and R4 and an N-MOS transistor in place of R5.

Resistors R6 and R7, that are connected in series between the power source voltages $V_{DD}$ and $V_{SS}$ form a resistor voltage divider circuit 73 for applying the reference voltage 5 to the other input of the differential amplifier, and the logic threshold voltage of CMOS, e.g., $-2.5$ V, is taken out from between these resistors R6 and R7.

A resistor R8, a P-type MOS transistor P13 and a resistor R9, that are connected in series, form an amplifier 74 for amplifying the output of the differential amplifier to be applied to the gate of P-MOSFET P13. The output of this amplifier 74 is taken out from between P-MOSFET P13 and the resistor R9 and is applied to the gate electrode of N-MOSFET N12 as well as to the output terminal VC.

The circuit 7 constructed as above is a control voltage generation circuit. When the potential of the input EI of the input circuit 8 having the circuit construction shown in FIG. 2 is $V_{BB}$, this circuit 7 generates a control voltage $V_{CON}$ at the output terminal VC so that the potential of the output CO becomes the logic threshold voltage of CMOS. Assume the potential of 4 is higher than the reference voltage 5. Then, the potential of the output 6 of the differential amplifier 72 drops, the gate-to-source voltage of P-MOSFET P13 becomes great so that a current flowing through the resistor R9 becomes great, and the potential of the output VC rises. Accordingly, the gate-to-source voltage of N-MOSFET N12 becomes great and resistance becomes small, thereby reducing the potential of 4. When the potential of 4 is lower than the reference voltage 5, on the contrary, the potential of the output 6 of the differential amplifier 72 rises, the potential of the output VC drops and the potential of 4 is raised. Accordingly, the voltage $V_{CON}$ of the output VC is controlled so as to be equal to the reference voltage of 5, even though the potential of 4 changes due to the statistical variation of devices, fluctuation of temperature and power source voltage and change of $V_{BB}$. Inside the same chip, the statistical variation of devices is small and the temperature and power source voltages change in the same direction. Accordingly, if at least one control voltage generation circuit 7 is disposed on the chip, its output voltage $V_{CON}$ can be applied to the gate electrodes of N-MOSFETs N11 in all the input circuits 8.

The input circuit 8 in this embodiment is fundamentally a PMOS circuit and has low load driving capability. If a large load is directly connected, therefore, the delay time will become great. Therefore, a CMOS inverter 9 is inserted as a buffer into the next stage so as to drive the internal circuit of CMOS LSI by the output of the inverter. The CMOS inverter 9 consists of a P-type MOS transistor P14 and an N-type MOS transistor N15 that are connected in series between the power source voltages $V_{DD}$ and $V_{SS}$. The gates of both transistors P14 and N15 are connecetd to the output CO of the input circuit 8, and the output is taken out from between both transistors.

Figure 4:
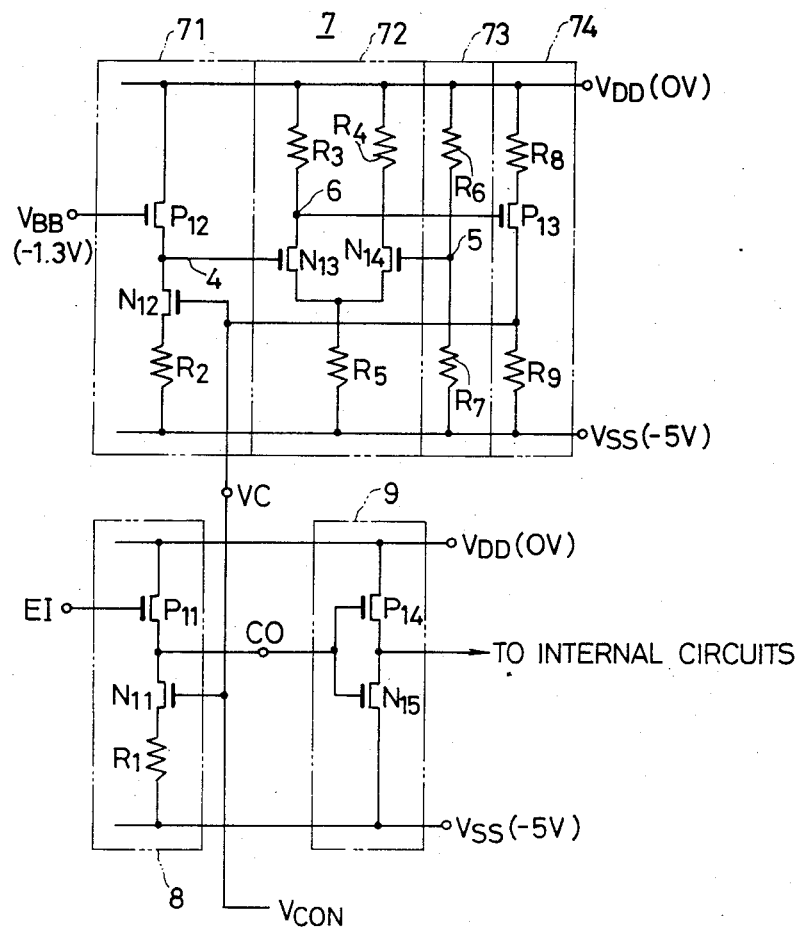
FIGS. 4 and 5 are circuit diagrams, each showing the construction of a control voltage generation circuit for generating the control voltage for the input circuit shown in FIG. 2.

In FIG. 4, the load resistors R1 and R2 can be replaced by N-type MOS transistors or can be omitted by using N11 and N12 also as the load MOS transistors.

Figure 5:
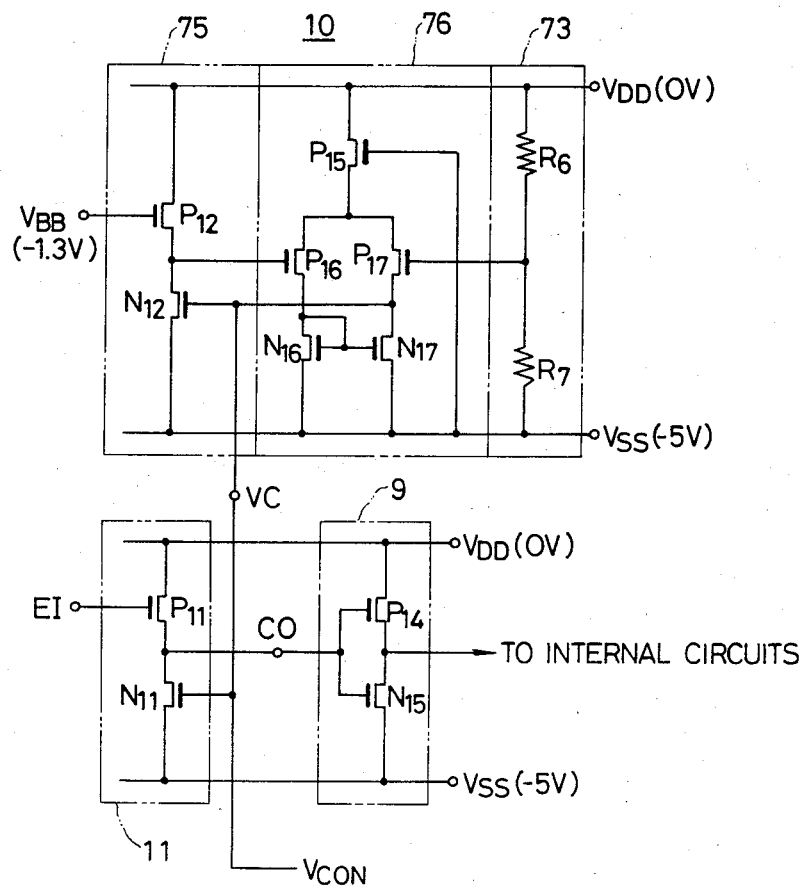

FIG. 5 shows an embodiment in which the load resistors R1 and R2 are omitted. Reference numeral 11 represents the input circuit and 10 represents the control voltage generation circuit. The initial stage of the circuit 10 is an circuit 75 having the same circuit construction as the input circuit 11, and the next stage is a differential amplifier 76 consisting of P-MOS transistors P15, P16, P17 and N-MOS transistors N16, N17. In this embodiment, the amplifier 74 of the final stage consisting of P13, R8, R9 of FIG. 4 is omitted. The the differential amplifier is constituted by use of the P-MOS transistors P16 and P17 in place of the N-MOS transistors N13 and N14 of FIG. 4, and the d.c. level of its output is matched with the gate input of N12. The output VC of this control voltage generation circuit 10 is taken out from between P-MOSFET P17 and N-MOSFET N17.

In comparison with the embodiment shown in FIG. 4, the embodiment shown in FIG. 5 has a smaller gain for the amplifier and the ability to compensate for the fluctuation of temperature and power source voltage drops somewhat in comparison with FIG. 4. However, the embodiment serve sufficiently in many practical application. Incidentally, symbol P15 represents a constant current source and N16 and N17 represent load MOS transistors. The resistors shown in FIG. 4 can also be used in place of them.

Figure 6:
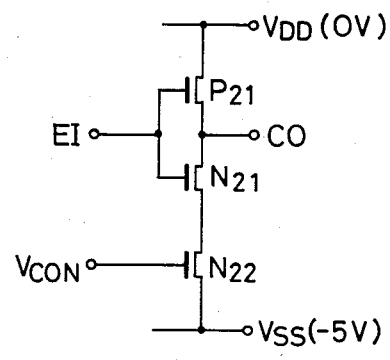
FIG. 6 is a circuit diagram showing the construction of the input circuit in accordance with another embodiment of the present invention.
Figure 7:
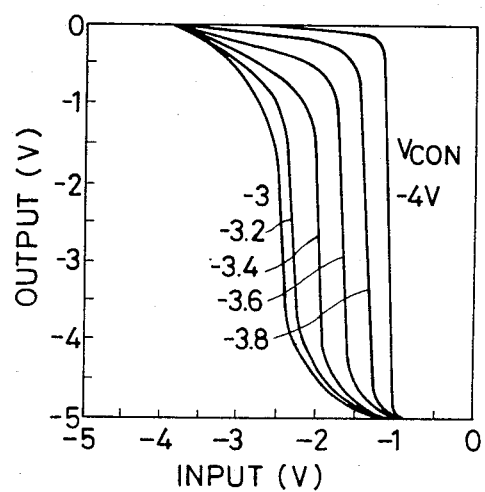
FIG. 7 is a diagram showing the transfer characteristics of the circuit shown in FIG. 6.

In the two embodiments described above, the circuit construction shown in FIG. 2 is used for the input circuit. However, the transfer characteristics of the input circuit can be changed as depicted in FIG. 7 by use of an input circuit shown in FIG. 6, by changing the control voltage $V_{CON}$. In FIG. 6, symbol P21 represents a P-MOS transistor and N21 and N22 represent N-MOS transistors. They are connected in series between the power source voltages $V_{DD}$ and $V_{SS}$. The gate electrodes of P-MOSFET P21 and N-MOSFET N21 are connected to a common input ET for receiving an input signal, and the output CO is taken out from between P21 and N21. The control voltage $V_{CON}$ is applied to the gate electrode of N-MOSFET N22.

Figure 8:
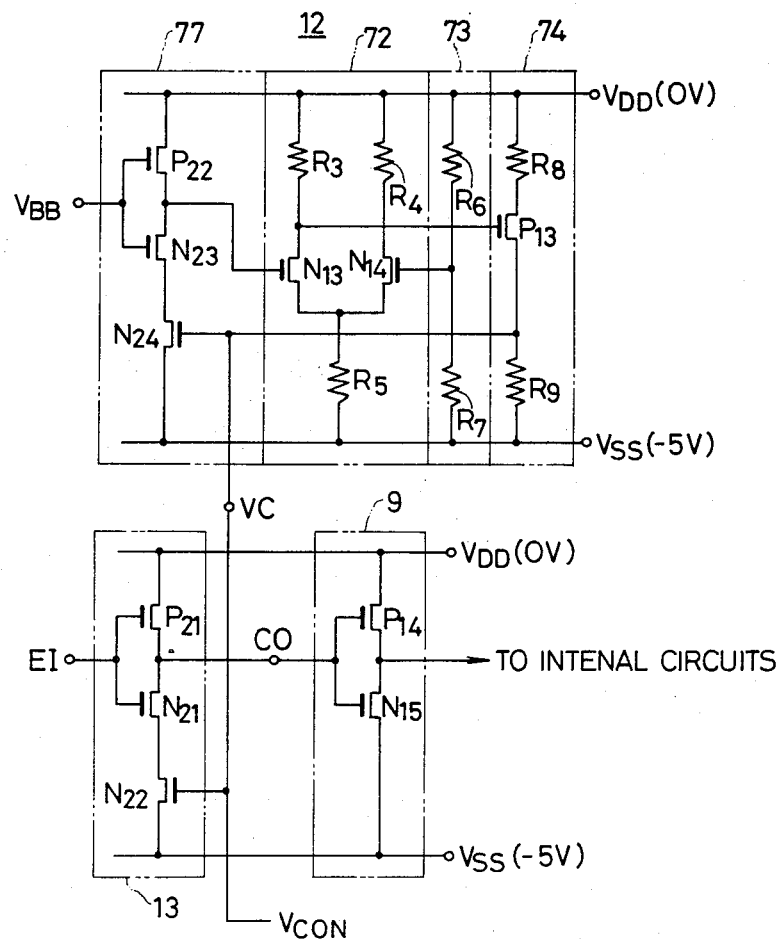
FIGS. 8 and 9 are circuit diagrams, each showing the construction of a control voltage generation circuit for generating the control voltage for the input circuit of FIG. 7.
Figure 9:
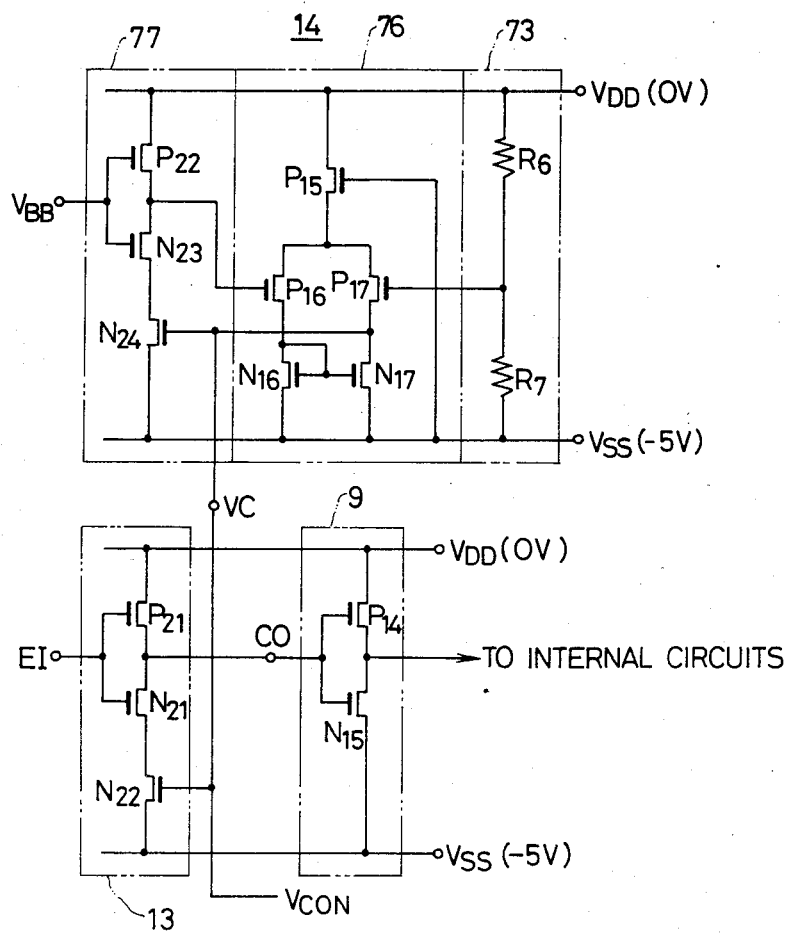

In the same way as the constructions shown in FIGS. 4 and 5, therefore, a level conversion input circuit for converting the ECL level to the CMOS level can be constructed by providing a control voltage generation circuit. The embodiments for this are shown in FIGS. 8 and 9. In these figures, reference numerals 12, 14 represent the control voltage generation circuits, respectively, and reference numeral 13 represents the input circuit. The control voltage generation circuit 12 is formed by replacing the initial stage 71 of the control voltage generation circuit 7 of FIG. 4 by the same circuit 77 as the input circuit 13. The control voltage generation circuit 14 is likewise formed by replacing the initial stage 75 of the control voltage generation circuit 10 by the same circuit 77 as the input circuit 13. Other than this, the circuit 12 corresponds to the circuit 7 of FIG. 4 while the circuit 14 corresponds to the circuit 10 of FIG. 5. These circuits operate in the same way as the circuit explained with reference to FIGS. 4 and 5.

Incidentally, the statistical variation of devices inside the same chip is small and the temperature and the power source voltages change in the same direction. Accordingly, if at least one control voltage generation circuit is disposed on the chip and its output voltage $V_{CON}$ is applied to all the input circuits, it is possible to make the potential of the output CO equal to the logic threshold voltage of CMOS when the potential of the threshold voltage $V_{BB}$ of ECL is applied to the input EI of each input circuit.

Figure 10:
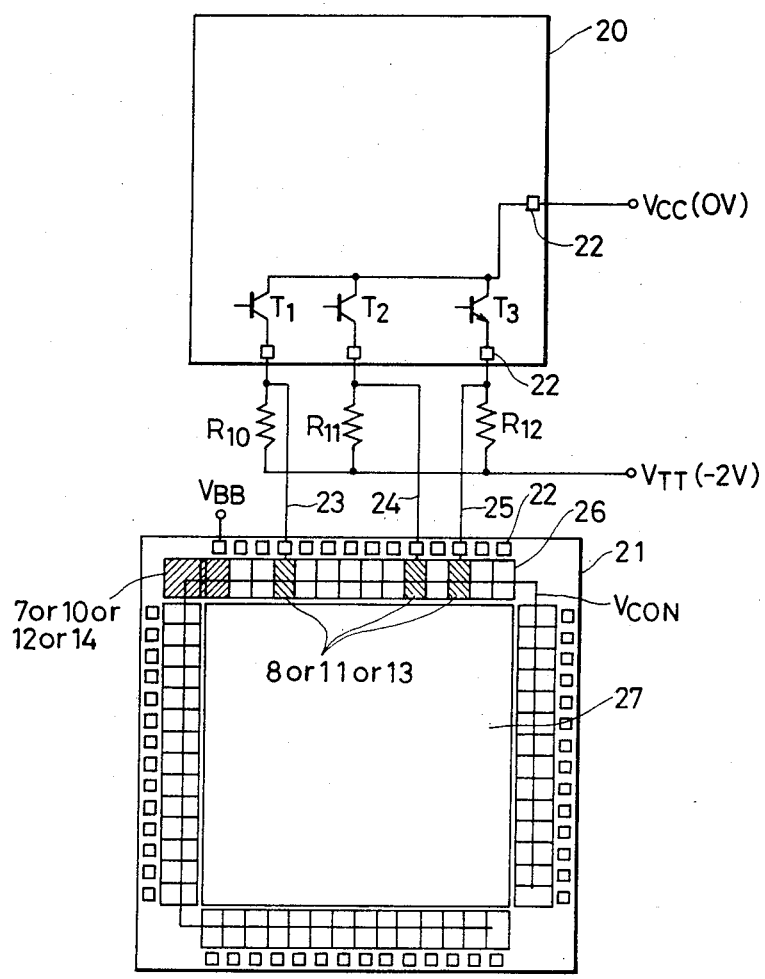
FIG. 10 is a circuit diagram showing the connection between the CMOS LSI including the input circuit and control voltage generation circuit of the present invention and ECL LSI.

FIG. 10 shows the connection betwen ECL LSI and CMOS LSI and an example of the layout of CMOS LSI including the input circuit and the control voltage generation circuit. In the drawing, reference numeral 20 represents ECL LSI and 21 represents CMOS LSI. Reference numeral 22 represents each bonding pad. $T_1$, $T_2$ and $T_3$ are emitter follower transistors of the ECL output circuit, and $R_{10}$, $R_{11}$ and $R_{12}$ are terminating resistors. Reference numerals 23, 24 and 25 represent the respective output signals. $V_{CC}$ and $V_{TT}$ are power source voltages, and 26 represents the areas of the input-out circuit of CMOS LSI 21. 27 represents the area of the internal circuits of CMOS LSI 21. The above-mentioned input circuits 8 or 11 or 13 and the inverter circuit 9 are placed in the areas of the input-output circuit corresponding to the bonding pads which receive the output signals 23 through 25, and the control voltage generation circuit 7 or 10 or 12 or 14 is placed at a corner of the chip. In this layout the initial stage of the control voltage generation circuit, that is, the circuit portion which is the same as the input circuit, uses one of the areas 26 of the input-output circuit, and the reference voltage $V_{BB}$ is applied from outside. $V_{BB}$ may be supplied by a stabilized circuit inside LSI. In such a case, the areas of the input-output circuit corresponding to the bonding pad need not be used. The control voltage generation circuit is wired in such a fashion that its output $V_{CON}$ can be applied to all the areas 26 of the input-output circuit.

In accordance with the present invention, at least only one control voltage generation circuit, which requires a large number of devices and large power consumption, needs be disposed. The the input circuits, which must be equal in number to the number of input signals, have low power consumption. Therefore, overall, small area, low power level conversion input circuit can be constituted.

The foregoing description deals with the case in which the ECL level is converted to the CMOS level. It is to be understood, however, that conversion from the TTL level to the CMOS level, for example, can also be effected by changing the reference voltage to be applied as $V_{BB}$. In the case of conversion from the TTL level to the CMOS level, the power source voltage $V_{DD}$ is 5 V and $V_{ss}$ is 0 V. Accordingly, in the embodiments shown in FIGS. 2, 4, 5, 6, 8 and 9, the P-MOS transistors may be replaced by N-MOS transistors and the N-MOS transistors, by P-MOS transistors.

What is claimed is:

1. A level conversion circuit including:
a first input circuit comprising at least a first MOS transistor having a first terminal, a second terminal and a gate terminal, and a second MOS transistor which has a channel of opposite conductivity type to said first MOS transistor and which has a first terminal, a second terminal and a gate terminal, wherein said gate terminal of said first MOS transistor is coupled to the input of said first input circuit for receiving an input signal, said first terminal of said first MOS transistor is coupled to a first voltage source, said second terminal of said first MOS transistor is coupled to said second terminal of said second MOS transistor, said first terminal of said second MOS transistor is coupled to a second voltage source, and an output of said first input circuit is taken out from said second terminal of said first MOS transistor; and
a voltage generation circuit applying a voltage to the gate terminal of said second MOS transistor of said first input circuit,
wherein the voltage from said voltage generation circuit controls the logic threshold voltage of said first input circuit.

2. The level conversion input circuit as defined in claim 1 wherein said first input circuit includes a first load connected in series with said second MOS transistor.

3. The level conversion input circuit as defined in claim 1 wherein said voltage generator circuit comprises a second input circuit which receives a first reference voltage as its input and which comprises at least a third MOS transistor having a first terminal, a second terminal and a gate terminal, and fourth MOS transistor which has a channel of opposite conductivity type to said third MOS transistor and has a first terminal, a second terminal and a gate terminal, wherein said gate terminal of said third MOS transistor is coupled to receive said first reference voltage, said first terminal of said third MOS transistor is coupled to said first voltage source, said second terminal of said third MOS transistor is coupled to said second terminal of said fourth MOS transistor, said first terminal of said fourth MOS transistor is coupled to said second voltage source and an output of said second input circuit is taken out from said second terminal of said third MOS transistor, and an amplification circuit of at least one stage which receives the output of said second input circuit and a second reference voltage as its inputs and amplifies the difference between these voltages, wherein the output of said amplification circuit is the output of said voltage generation circuit.

4. The level conversion input circuit as defined in claim 3 wherein said control voltage generation circuit has a voltage division circuit for generating said second reference voltage.

5. The level conversion input circuit as defined in claim 3 wherein said amplification circuit comprises a differential amplifier which receives the output of said second input circuit and said second reference voltage as its input.

6. The level conversion input circuit as defined in claim 5 wherein said differential amplifier comprises fifth and sixth MOS transistors having gates which are coupled to receive the output of said second input circuit and said second reference voltage, respectively, a constant current source providing a constant current to both of said fifth and sixth MOS transistors and a load connected to at least one of said fifth and sixth MOS transistors, and wherein the output of said differential amplifier is taken out from between either one of said fifth and sixth MOS transistors and said load.

7. The level conversion input circuit as defined in claim 3 wherein said amplification circuit is comprised of a differential amplifier which receives the output of said second input circuit and said second reference voltage as its inputs, and an amplifier which amplifies the output of said differential amplifier.

8. The level conversion input circuit as defined in claim 7 wherein said amplifier comprises a fifth MOS transistor having a gate to which the output of said differential amplifier is applied, and a load connected in series with said fifth MOS transistor, and wherein the output of said amplifier is taken out from between said fifth MOS transistor and said load.

9. The level conversion input circuit as defined in claim 1 wherein said first MOS transistor comprises a P-type MOSFET, said second MOS transistor comprises an N-type MOSFET, a voltage of an ECL level is applied to the input of said first input circuit and a voltage of a CMOS level is taken out from the output of said first input circuit.

10. The level conversion input circuit as defined in claim 9 which includes a CMOS inverter connected to the output of said first input circuit.

11. The level conversion input circuit as defined in claim 1 wherein said first input circuit includes a third MOS transistor which has a channel of the same conductivity type as said second MOS transistor and which has a first terminal, a second terminal and a gate terminal, wherein said second terminal of said third MOS transistor is coupled to the second terminal of said first MOS transistor, said first terminal of said third MOS transistor is coupled to second terminal of said second MOS transistor, and said gate terminal of said third MOS transistor is coupled to the input of said first input circuit.

12. The level conversion input circuit as defined in claim 11 wherein said first MOS transistor comprises a P-type MOSFET, said second and third MOS transistors are comprised of N-type MOSFETs, respectively, a voltage of an ECL level is applied to the input of said first input circuit and a voltage of a CMOS level is taken out from the output of said first input circuit.

13. The level conversion input circuit as defined in claim 12 which includes a CMOS inverter connected to the output of said first input circuit.

14. A CMOS integrated circuit equipped with a level conversion input circuit comprising:

a pluarlity of first input circuits connected in parallel with one another between a first voltage source and a second voltage source, each including at least a P-type first MOS transistor and an N-type second MOS transistor connected in series with one another between said first and second voltage sources, the gate of said first MOS transistor being connected to the input of said input circuit receiving an input signal, the output of said input circuit being taken out from between said first and second MOS transistors;

a plurality of CMOS inverters, wherein said CMOS inverters are respectively arranged so that one CMOS inverter is coupled to the output of one input circuit; and a voltage generation circuit applying a voltage to the gate of said second MOS transistor of each of said first input circuits to control the logic threshold voltage of said first input circuits, wherein the output of one of said CMOS inverters is used to drive an internal circuit of said integrated circuit.

15. The CMOS integrated circuit equipped with a level conversion input circuit as defined in claim 14 wherein each of said first input circuits and each of said CMOS inverters are disposed in the periphery of an area where said internal circuit is disposed in said integrated circuit.

* * * * *